US008841560B1

(12) United States Patent
Roberts

(10) Patent No.: US 8,841,560 B1
(45) Date of Patent: Sep. 23, 2014

(54) BACKPLANE SLOT INTERCONNECTION SYSTEM, METHOD AND APPARATUS

(75) Inventor: Brian Doane Roberts, Cupertino, CA (US)

(73) Assignee: Dawn VME Products, Fremont, CA (US)

( * ) Notice: Subject to any disclaimer, the term of this patent is extended or adjusted under 35 U.S.C. 154(b) by 359 days.

(21) Appl. No.: 13/289,558

(22) Filed: Nov. 4, 2011

Related U.S. Application Data

(60) Provisional application No. 61/414,829, filed on Nov. 17, 2010.

(51) Int. Cl.
*H05K 1/11* (2006.01)
*H05K 7/00* (2006.01)

(52) U.S. Cl.
USPC ............ 174/261; 361/777; 361/788; 361/790

(58) Field of Classification Search
CPC .......... H01R 9/09; H01R 9/096; H01R 9/097; H01R 9/098; H01R 23/68; H01R 23/6806; H05K 1/14; H05K 1/141; H05K 1/142; H05K 1/144; H05K 1/11; H05K 1/111; H05K 1/112; H05K 1/114; H05K 3/36; H05K 3/361; H05K 3/363; H05K 7/023; H05K 7/026; H05K 7/02; H05K 7/1459; H05K 7/1438; H05K 2201/044
USPC .......... 174/250, 261; 361/736, 743, 748, 760, 361/777, 784, 788, 789, 790, 792, 803, 361/807–810
See application file for complete search history.

(56) References Cited

U.S. PATENT DOCUMENTS

| | | | |
|---|---|---|---|
| 4,700,274 A * | 10/1987 | Laut | 361/729 |
| 6,711,028 B2 * | 3/2004 | Iny | 361/788 |
| 7,154,761 B1 * | 12/2006 | Camerlo et al. | 361/788 |
| 7,891,980 B2 | 2/2011 | Frasco | |
| 7,935,896 B2 | 5/2011 | Morlion et al. | |
| 2003/0214792 A1 * | 11/2003 | Credelle et al. | 361/760 |
| 2003/0222282 A1 * | 12/2003 | Fjelstad et al. | 257/200 |
| 2004/0094328 A1 * | 5/2004 | Fjelstad et al. | 174/251 |
| 2005/0156295 A1 * | 7/2005 | Corisis et al. | 257/668 |
| 2007/0275607 A1 | 11/2007 | Kwark et al. | |
| 2009/0201658 A1 * | 8/2009 | Lemke et al. | 361/788 |
| 2011/0100673 A1 * | 5/2011 | Takamatsu et al. | 174/102 SP |
| 2011/0232938 A1 * | 9/2011 | Kodama et al. | 174/117 F |
| 2011/0290541 A1 * | 12/2011 | Yeh | 174/257 |

* cited by examiner

*Primary Examiner* — Hoa C Nguyen
(74) *Attorney, Agent, or Firm* — Thomas Schneck; Mark Protsik

(57) ABSTRACT

Herein disclosed are an apparatus, a system and a method, selectively linking signals between or among slots on a backplane. A backplane printed circuit board has defined slots, each of which receives a card or module. One or more arrays of solder ball mounting pads correspond to signal lines of the slots. Each of one or more signal mapping overlay printed circuit boards has at least one signal trace connected to solder ball landing pads. Selected solder ball mounting pads of the backplane printed circuit board are connected to selected solder ball landing pads of the signal mapping overlay printed circuit board by solder balls. The signal trace or traces of the signal mapping overlay printed circuit board or boards connect the corresponding selected signal lines between or among the slots of the backplane. The backplane and signal mapping overlay printed circuit boards may have mirrored connection arrays.

20 Claims, 8 Drawing Sheets

BACKPLANE SLOT INTERCONNECTION SYSTEM, METHOD AND APPARATUS

CROSS-REFERENCE TO RELATED APPLICATION

This application claims the benefit of U.S. provisional application No. 61/414,829, filed Nov. 17, 2010.

TECHNICAL FIELD

The present invention relates to the fields of printed circuit board (PCB) backplanes and printed circuit board interconnections.

BACKGROUND

A backplane is a specialized type of circuit board typically used to connect signals between multiple circuit cards or modules (e.g. populated printed circuit boards). Each such circuit card or module occupies a slot of the backplane and is plugged edgewise into the backplane by way of a respective connector soldered, press-fitted or otherwise installed to the backplane. Different architectures for connecting the multiple cards exist to accomplish different types of communication, and permit different levels of data transfer bandwidth.

One backplane class implements parallel multi-drop connections to provide signal links between cards. This architecture requires a large number of slow speed signals connected in parallel to achieve high bandwidth data transfer between cards. Since this architecture is multi-drop in nature, cards can be installed in different slot locations on the multi-drop signal bus without loss of communication. The multi-drop connection scheme has limited data bandwidth caused by all the cards being connected on the same signal lines.

Another backplane class implements point-to-point connections between cards for signal connections. This architecture usually implements very high speed signals transmitted over tuned copper circuit links. These signals, due to their high frequency nature, cannot be connected to multiple cards as is done in the multi-drop architecture. Because of the point-to-point nature of these connections, cards must be installed in specific slots to communicate.

Another class of backplane architecture implements both multi-drop and point-to-point signal connection types. This architecture also requires the circuit cards to be installed in specific locations to permit communication over the point-to-point high frequency links.

Each of these backplane architectures has a fixed set of connection link features. Known backplane architectures have trade-offs that limit the flexibility of card position on the backplane and limit high bandwidth data links between cards.

For example, while the multi-drop backplane architecture does allow the flexibility of connecting cards in different slot locations, multi-drop backplanes need a very large quantity of parallel, low frequency connections to achieve a high data link bandwidth between cards. Connectors used in this architecture frequently do not have a sufficient number of pins to achieve a high data bandwidth capability.

The point-to-point backplane architecture has a differing set of trade-offs. In order to achieve high data bandwidth, point-to-point backplane architectures require specialized high frequency tuned circuit signal links. When using this type of point-to-point signal connections, plug in cards are confined to fixed and specific locations on the backplane printed circuit board (PCB) to achieve connectivity, which may not be optimal for other mechanical and system implementation reasons. In addition, the high frequency, point-to-point connections can also be problematic when implemented directly in a backplane, due to noise impacts on signal quality from adjacent signal traces and power layers in the backplane.

When high frequency, point-to-point connections are made in a backplane, other situations arise from the signal path in the backplane that affect the tuned circuit characteristics. If the signal passes between layers through "via" style connections to complete a signal path, high frequency signals experience degradation from reflections caused by "stubs" in the signal path. Stubs are parts of the signal path that branch off the main path between the 2 connection points. The length of these stubs in the signal path determines the range of frequencies that are degraded. Efforts to remove these unwanted stubs from the signal path increase the cost of the backplane fabrication, by requiring the additional process of back drilling the via connections to eliminate these signal degrading stubs, caused by the PCB fabrication method.

SUMMARY

A backplane apparatus, a backplane system and a method for interconnecting slots on a backplane make use of a signal mapping overlay printed circuit board. The signal mapping overlay printed circuit board attaches to a backplane printed circuit board and selectably connects signal lines between or among the slots of the backplane.

In a backplane apparatus, a backplane printed circuit board has a plurality of defined slots. Signal lines from the slots are connected to a first connection array.

The backplane apparatus includes at least one signal mapping overlay printed circuit board. Each signal mapping overlay printed circuit board has signal paths connecting to a second connection array. The first connection array and the second connection array form one or more mirrored connection arrays. The mirrored connection array or arrays support selectable location of a plurality of conductive interconnects. The conductive interconnects selectably connect signal lines from two or more of the slots via the signal paths of the signal mapping overlay printed circuit board. The conductive interconnects may be solder balls.

In a backplane system, a backplane printed circuit board has a circuit board connector face and a signal mapping face. The backplane printed circuit board has a plurality of defined slots, including a first slot and a second slot. Each slot has a corresponding connector on the circuit board connector face of the backplane printed circuit board. Each connector is configured to receive a respective card or module. The signal mapping face of the backplane printed circuit board has an array of solder ball mounting pads. The solder ball mounting pads correspond to signal lines of the slot.

The backplane system includes at least one signal mapping overlay printed circuit board. Each signal mapping overlay printed circuit board has a plurality of signal traces. Each signal trace has a first solder ball mounting pad at a first end of the signal trace and a second solder ball landing pad at a second end of the signal trace.

The backplane system includes solder balls. The solder balls are selectably located on the array of solder ball mounting pads of the signal mapping face of the backplane printed circuit board, so as to form selectable electrical connections.

A first solder ball is selectably located on the array of solder ball mounting pads. The first solder ball electrically connects a solder ball mounting pad of a signal line of the first slot to a first solder ball landing pad of one of the signal traces of the signal mapping overlay printed circuit board.

A second solder ball is selectably located on the array of solder ball mounting pads. The second solder ball electrically connects a solder ball mounting pad of a signal line of the second slot to a second solder ball landing pad of the one of the signal traces of the signal mapping overlay printed circuit board. The signal line of the first slot is thusly connected to the signal line of the second slot via the one of the signal traces on the signal mapping overlay printed circuit board.

In a method for interconnecting slots on a backplane, a backplane printed circuit board has slots with signal lines. The signal lines of the slots are connected to arrays of solder ball mounting pads. The arrays of solder ball mounting pads are on a signal mapping face of the backplane printed circuit board.

Signal traces of a signal mapping overlay printed circuit board are connected to solder ball landing pads. The solder ball landing pads are on a solder pad face of the signal mapping overlay printed circuit board.

Selected solder ball mounting pads are connected to selected solder ball landing pads, using solder balls. Thereby, selected signal traces are used to connect selected signal lines between or among the slots via the signal mapping overlay printed circuit board.

DETAILED DESCRIPTION

Figure 1:
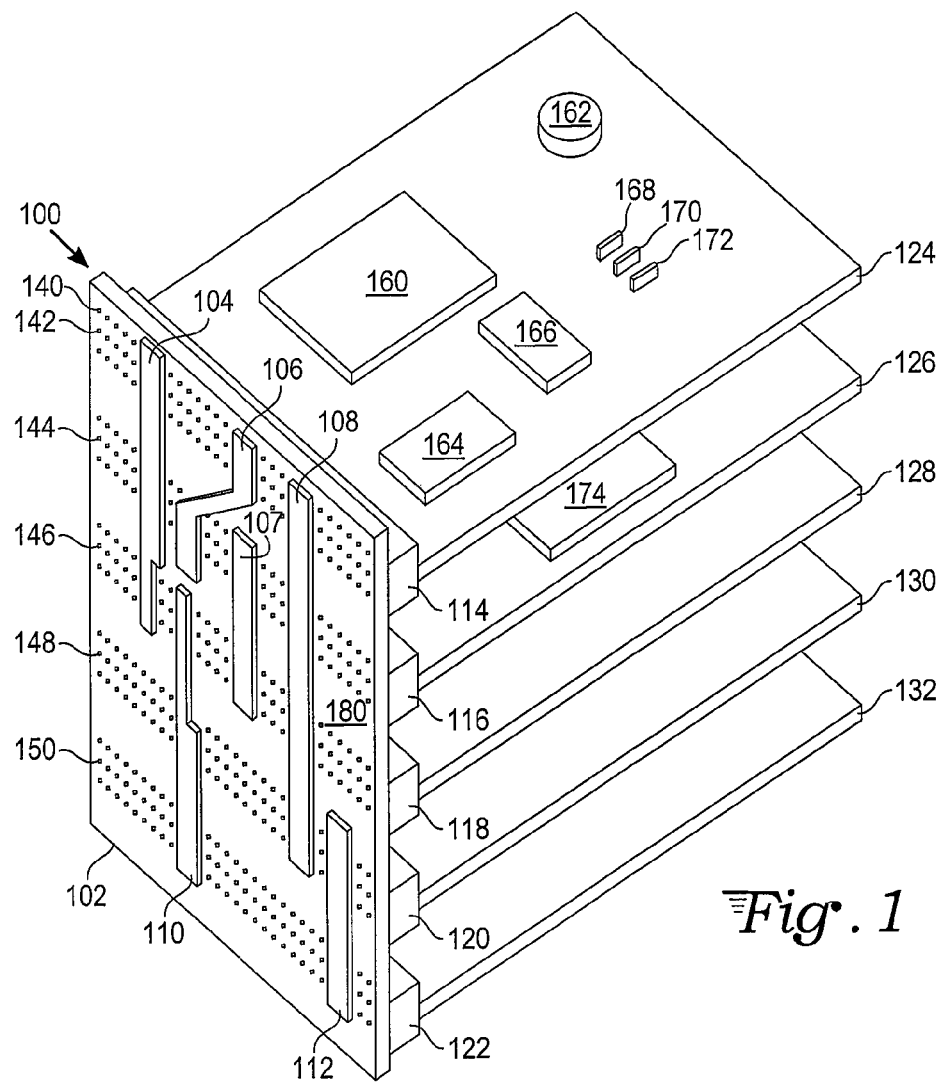
FIG. 1 is a perspective view of a backplane system, showing a plurality of Signal Mapping Overlay boards selectably attached to a backplane printed circuit board, in accordance with the present invention.

With reference to FIG. 1, there is shown a backplane slot interconnection system 100, in which one or more Signal Mapping Overlay printed circuit boards 104, 106, 107, 108, 110, 112 are selectably attached to a backplane printed circuit board 102, in accordance with the present invention. The backplane slot interconnection system 100 and a corresponding method, which may be used in rapid prototyping, flexible manufacturing, small or large batch jobs, or large-scale manufacturing of backplanes, employs one or more of the Signal Mapping Overlay circuit board 104 and solder ball or other electrical connections to map and connect signals between or among slots of the backplane. In an embodiment of the backplane slot interconnection system 100 and method, one or more Signal Mapping Overlay circuit boards 104, or variations thereof, are attached as a Fabric Mapping Module to a backplane printed circuit board 102 using solder balls, as will be further described with reference to FIGS. 2-6. The Fabric Mapping Module determines the connections of signals between or among slots of the backplane. Each slot of the backplane has an associated connector 114, 116, 118, 120, 122, into which a card or a module e.g. a populated printed circuit board 124, 126, 128, 130, 132 is inserted as the card or module is installed in the backplane.

In the embodiment shown, the Signal Mapping Overlay circuit boards 104, 106, 107, 108, 110, 112 are attached to a signal mapping face 180 of the backplane printed circuit board 102. Arrays of solder pads 142, 144, 146, 148, 150 on the signal mapping face 180 of the backplane printed circuit board 102 correspond to slots of the backplane. The example printed circuit boards 124, 126, 128, 130, 132 have integrated circuits 160, 164, 166, 174 and discrete devices such as a transistor 162 and resistors 168, 170, 172, which are shown for illustration purposes.

Figure 1A:
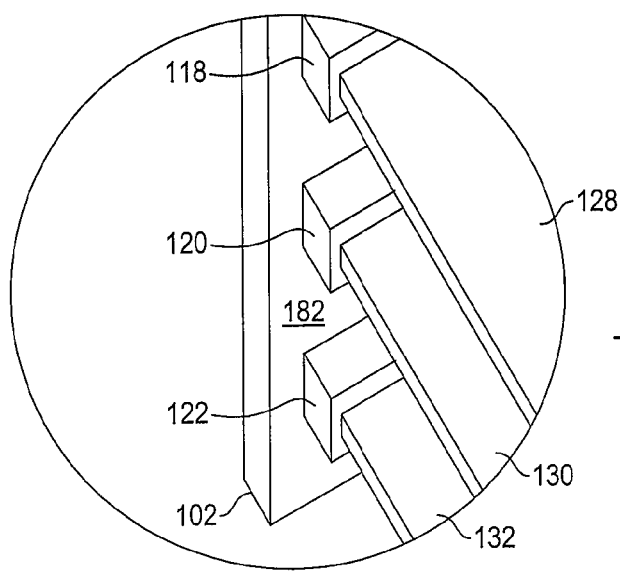
FIG. 1A is a close-up perspective view of the connector face of the backplane printed circuit board of FIG. 1, showing slot connectors receiving respective electronic cards or modules.

With reference to FIG. 1A, the connectors 118, 120, 122 are attached to the connector face 182 of the backplane printed circuit board 102. The connectors 118, 120, 122 have the populated printed circuit boards 128, 130, 132 installed therein.

Figure 2:
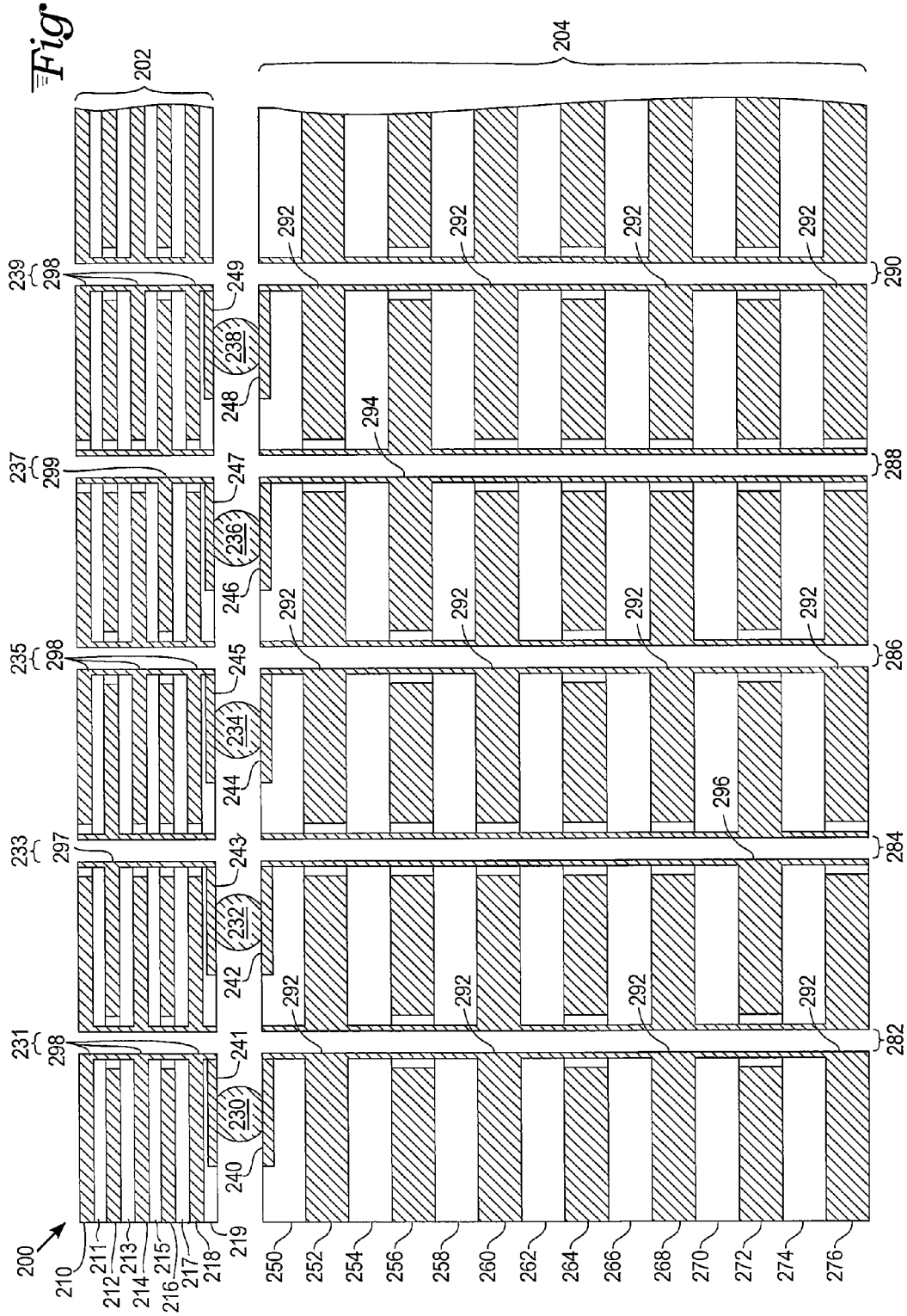
FIG. 2 is a cross-sectional view of a Signal Mapping Overlay board atop a backplane printed circuit board, such as shown in perspective view in FIG. 1. Selectably placed solder balls are used as conductive interconnects between solder pads of the facing boards.

In FIG. 2, a cross-section view shows solder balls 230, 232, 234, 236, 238 selectably connecting solder ball mounting pads 240, 242, 244, 246, 248 of the backplane printed circuit board 204 to solder ball landing pads 241, 243, 245, 247, 249 of a Signal Mapping Overlay printed circuit board 202. In the embodiment shown, both the backplane printed circuit board, and the Signal Mapping Overlay printed circuit board are multilayer printed circuit boards.

Firstly, the layers of the Signal Mapping Overlay printed circuit board 202 are considered. A signal layer 212 of a circuit is shown between dielectric layers 211, 213 of non-conductive dielectric material. Each signal layer 212, 216 upon which signal traces are etched, deposited or otherwise represented, is sandwiched by dielectric layers 211, 213 and 215, 217 followed by conductive ground plane layers 214, 218. A ground plane layer 210, 214, 218 may act as a shield layer for a signal layer 212, 216 above or below the ground plane layer 210, 214, 218 and may act as a shield layer for both a signal layer 212 above and a signal layer 216 below the ground plane layer 214. The example of FIG. 2 shows three ground plane layers 210, 214, 218 shielding two signal layers 212, 216 with an insulating dielectric layer 211, 213, 215, 217 between any two conducting layers. A solder ball landing pad 243 is connected to the through-hole or via 233 by a length of conductive material seen as an extension of the solder ball landing pad 243 that electrically and physically joins the two together, as will be discussed with reference to FIG. 4. Similar connections apply to the remaining solder ball landing pads 241, 245, 247, 249. Solder balls 230, 232, 234, 236, 238 in a solder ball grid array are melted and electrically connected to the solder ball landing pads 241, 243, 245, 247, 249 by an industry standard mounting process. The via connections 297, 298, 299 are shown to indicate electrical connections within the Signal Mapping Overlay board 202. Ground plane via connections 298 connect together all of the ground planes 210, 214, 218. Signal via connections 297, 299 connect respective plated through vias and signal layers and can be used to connect signal traces between signal layers 212, 216. For example, the signal via connection 297 connects the signal layer 212 and the plated through via 233 to each other and to the solder ball landing pad 243. The signal via connection 299 connects the signal layer 216 to the plated through via 237 and to the solder ball landing pad 247. The solder balls 230, 232, 234, 236, 238 are attached to the solder ball landing pads 241, 243, 245, 247, 249 using industry standard established methods. The solder ball grid array for this device, the Signal Mapping Overlay board 202, mirrors the solder ball mounting pads on the backplane printed circuit board 204 (see also FIGS. 4 and 4A).

Secondly, the layers of the backplane printed circuit board 204 are considered. Signal layers 256, 264, 272 are shown sandwiched between dielectric layers 254, 258, 262, 266, 270, 274 of nonconductive dielectric material. Ground plane layers 252, 260, 268, 276 act as shield layers for the signal layers 256, 264, 272 in a manner similar to that of the Signal Mapping Overlay printed circuit board 202. The use of ground plane layers to shield signal layers is known in the printed circuit board industry, and further embodiments of shielded printed circuit boards are readily devised. Solder ball mounting pads 240, 242, 244, 246, 248 are connected to plated through-holes or vias 282, 284, 286, 288, 290 by a length of conductive material seen as an extension of the solder ball landing pad, as will be discussed with reference to FIG. 4. The ground plane via connections 292 connect all of the ground planes 252, 260, 268, 276. The signal via connections 294, 296 connect respective plated through vias and signal layers and can be used to connect signal traces between signal layers 256, 264, 272. For example, the signal via connection 294 connects the signal layer 256 to the plated through via 237 and to the solder ball mounting pad 246. The signal via connection 296 connects the signal layer 272 to the plated through via 233 and to the solder ball mounting pad 242. The solder balls 230, 232, 234, 236, 238 are attached to the solder ball mounting pads 240, 242, 244, 246, 248 using industry standard established methods. The solder ball grid array for this device (see also FIGS. 4 and 4A), the backplane printed circuit board 204, mirrors the solder ball mounting pads on the Signal Mapping Overlay board 202.

The Signal Mapping Overlay circuit board 104, 106, 107, 108, 110, 112, 202 as shown in FIGS. 1 and 2 includes connections that are constructed of a shielded and controlled impedance dielectric stack, shown as dielectric layers 211, 213, 215, 217, 219. The dielectric stack not only helps to control impedance, but also controls the amount of capacitance between the signal layers 212, 216 and ground layers 210, 214, 218, and is used in constructing a stripline.

The impedance control of the stripline constructed for each signal trace is dependent upon the width of each signal trace and the thickness of dielectric used between the signal trace and the respective ground planes. Impedance of a stripline is expressed as an overall impedance of a specific stripline, which depends on the length of the stripline, or a length-independent, characteristic impedance of the stripline. The characteristic impedance of a stripline is calculated or measured in units of impedance per unit length, and is a useful concept for expressing impedance of a stripline on a cross-sectional basis. The overall end-to-end or total impedance of a particular stripline is thus the length of the stripline multiplied by the characteristic impedance of the stripline. A stripline is a known, controlled impedance structure made of stacked layers of ground plane, insulator, circuit trace, insulator and ground plane, and has electrical characteristics related to a coaxial cable. The speed or frequency of the signal that is conveyed as a differential signal pair on a specific matched pair of connections using striplines may be altered by changing the characteristics of the associated striplines such as by changing the width of the corresponding signal trace or the thickness of the dielectric to accommodate high speed signals. Standard manufacturing processes are used to route the Signal Mapping Overlay signal traces between the dielectric layers. This allows for consistent repeatability in the width of the signal trace, and decreases the chance for error in the manufacturing process.

In a variation, a microstrip is constructed for one or more signal traces, or the entirety of the signal traces, on a Signal Mapping Overlay circuit board. A microstrip is a known, controlled impedance structure related to the stripline, and can be fabricated on a printed circuit board. A microstrip has a circuit trace separated from a ground plane by a dielectric layer, with the circuit trace usually being on a face of the circuit board. In a further variation, a Signal Mapping Overlay circuit board uses a combination of striplines and microstrips for the signal traces.

When implementing a Signal Mapping Overlay circuit board, various considerations apply. A thin substrate may be preferred for the dielectric, and the thickness of the dielectric affects the impedance of a stripline or a microstrip. Minimizing the number of stubs and the stub length to a via decreases signal reflections. Tight-coupled differential pairs, with signal lines physically located close together, imparts an edge-to-edge coupling characteristic to the signal lines. Matched lengths for differential pairs or for a clock signal clocking a discrete signal or a differential pair matches the phases of the wavefronts of two signals so the signals arrive at the same time.

Figure 3:
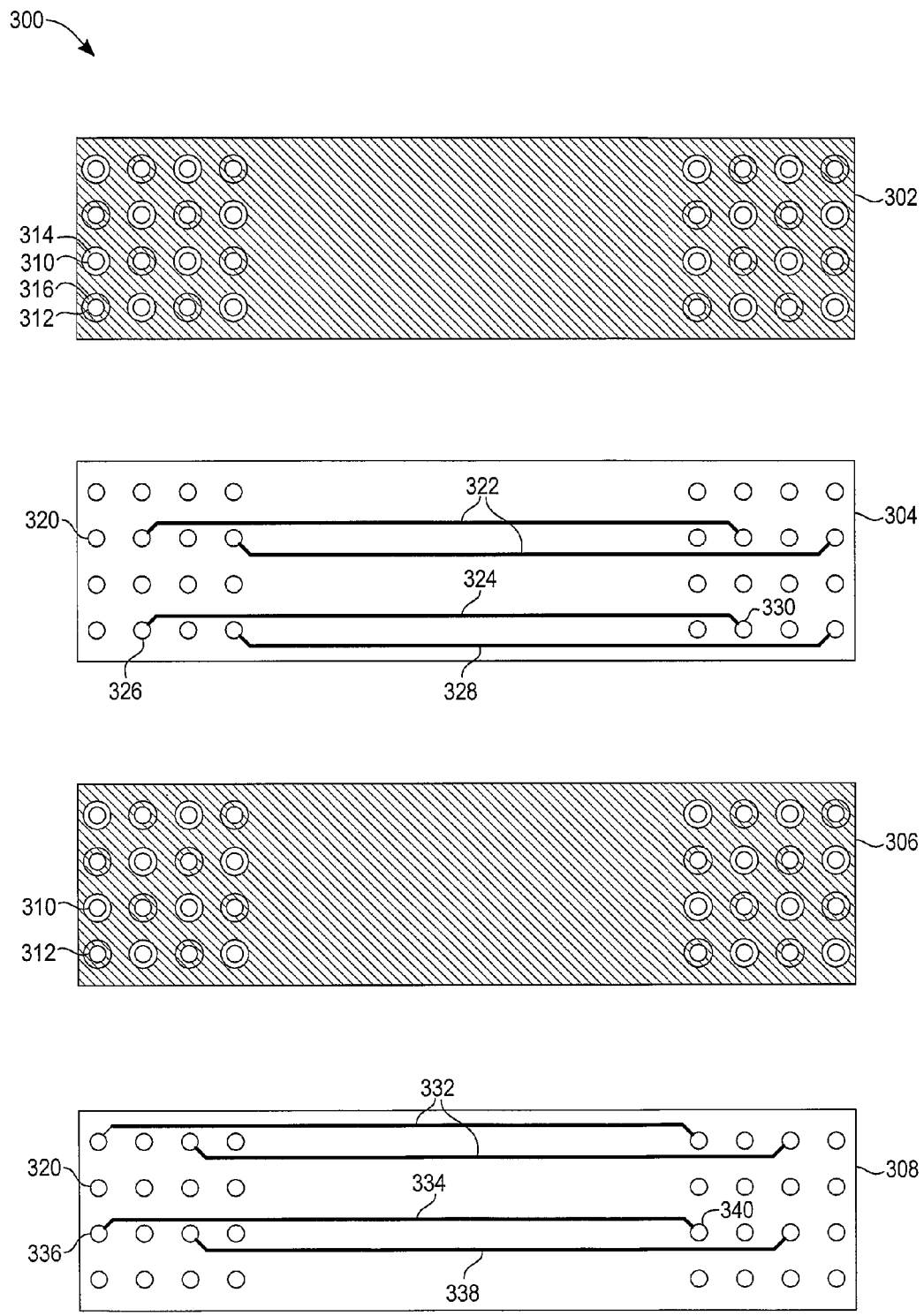
FIG. 3 is a top view of individual layers of a Signal Mapping Overlay board such as shown in FIG. 1, showing alternating ground planes and signal layers.

FIG. 3 is a top view of an embodiment of a disassembled Signal Mapping Overlay board 300 separated out as a ground plane 302, a first signal layer 304, a further ground plane 306, and a second signal layer 308. The ground layer 302 has ground connection vias 312 alternating with or between signal vias 310. Each ground connection via 312 has a metal connection 316 to the ground plane 302. Each signal via 310 is electrically isolated from the ground plane 302 by a non-metal region 314 surrounding the signal via 310. The signal via 310, which is a plated through-hole, passes through the ground layer 302, without electrical connection to the ground layer. All ground layers 302, 306 are shorted together, to provide shielding for the signal layers 304, 308.

The first signal layer 304 shows ground via 320, a first matched differential pair of signal traces 322 and a second matched differential pair of signal traces 324, 328. Each differential pair of signals is carried on impedance matched striplines, with a first stripline carrying the true value of the signal, and a second stripline carrying the complementary value of the signal. Signals thusly carried as a differential pair may be detected using a differential amplifier. As an example, positive differential signal trace 324 and negative differential signal trace 328 may carry the respective true and complementary values of a signal and be the matched differential pair of signal traces that form the matched impedance striplines for a specified signal. The matched pair of signal traces 324 and 328 is identically matched in length and width, i.e. both traces have the length and width of signal trace 324 from a first signal path via 326 to a second signal path via 330. The connection style is repeated for multiple signal layers 308 as needed, so long as the connections made are impedance matched from one connection to another and the signal layers are separated by one or more ground layers. For example, the second signal layer 308 has a first differential pair of signal traces 332 and a second pair of differential signal traces 334 and 338. The matched pair of signal traces 334 and 338 is identically matched in length and width, i.e. both traces have the length and width of the signal trace 334 from a first signal path via 336 to a second signal path via 340. In one example, transmitting and receiving signals are not located on the same signal layer. In a further example, transmitting and receiving signals can be located on the same or differing signal layers.

Figure 4:
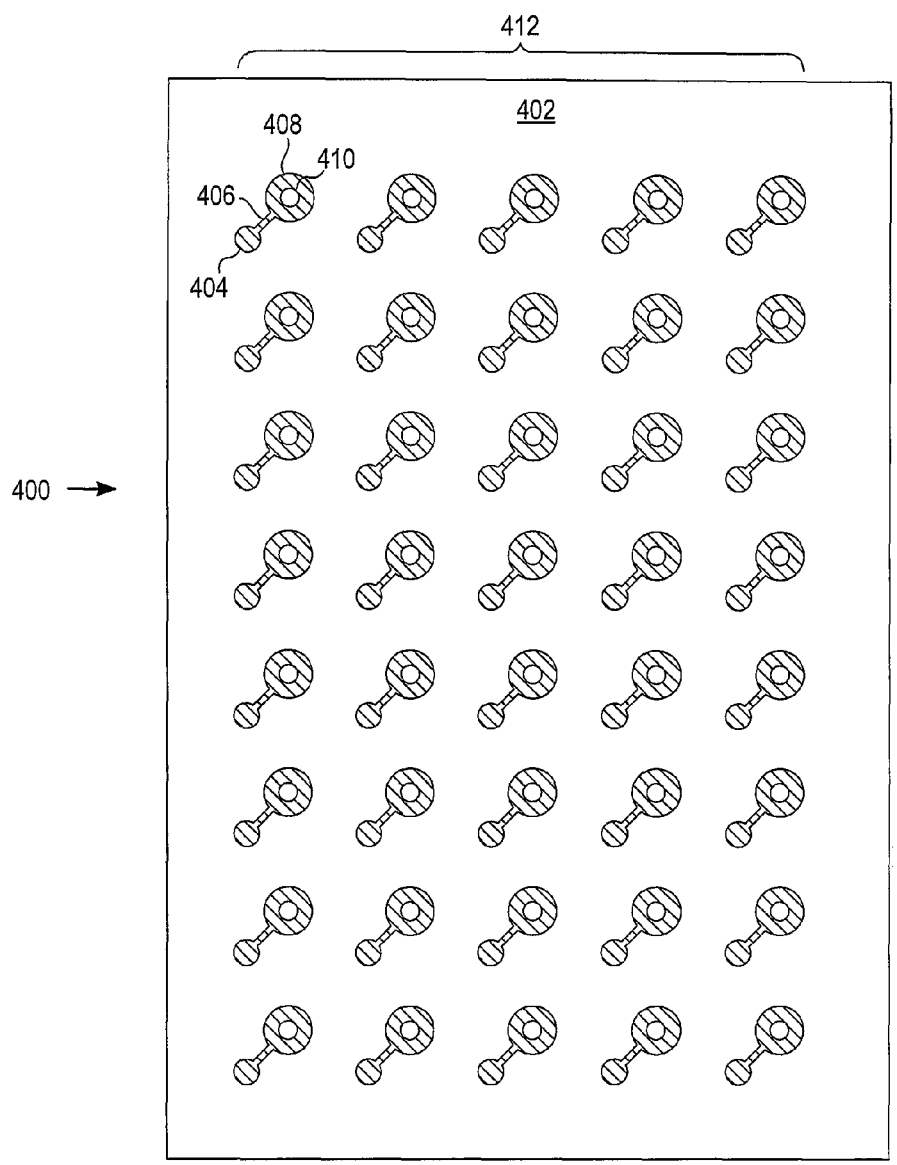
FIG. 4 is a top view of a portion of a signal mapping face of a backplane printed circuit board such as of FIGS. 1, 1A and 2, showing an array of solder ball mounting pads and corresponding circuit trace connections to the connector through-holes or vias.

FIG. 4 shows a top view of a portion of a backplane printed circuit board 400, and shows an embodiment of the signal mapping face 402 to which a Signal Mapping Overlay board and associated solder balls can be connected. The view shows the solder ball mounting pad 404 and the metal connection 406 to the plated through-hole or via 410, as well as the associated surrounding metal plating 408 on the surface around the plated through-hole or via 410. The layout of the solder ball mounting pad array 412, which is an array of solder ball mounting pads 404, is a mirrored layout that matches the Signal Mapping Overlay board solder ball landing pad array. In this embodiment, the array of solder ball pads of the Signal Mapping Overlay board and the corresponding array of solder ball pads of the backplane printed circuit board form one or more mirrored connection arrays. This ensures that the Signal Mapping Overlay board positively mates with the backplane printed circuit board and has a strong electrically conductive bond between the two devices.

Figure 4A:
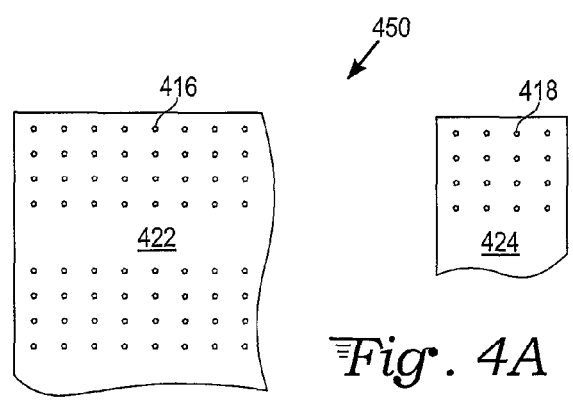
FIG. 4A is a top view of mirrored connection arrays of solder mounting pads.

With reference to FIG. 4A, one embodiment of mirrored connection arrays 450 of solder ball mounting pads is shown. A portion of a backplane printed circuit board has an array of solder ball mounting pads 416 on the signal mapping face 422. A portion of the Signal Mapping Overlay printed circuit board has an array of solder ball mounting pads 418 on the solder ball pad face 424. Spacing and dimensions of the solder ball pads in the mirrored arrays 450 are matched and mirrored, i.e. geometrically reflected, so that solder balls selectably placed on pads of one array will align with pads of the other array for electrical connection. Although embodiments shown herein have square or rectangular arrays of pads, further embodiments have further arrangements of pads in the arrays.

Figure 5:
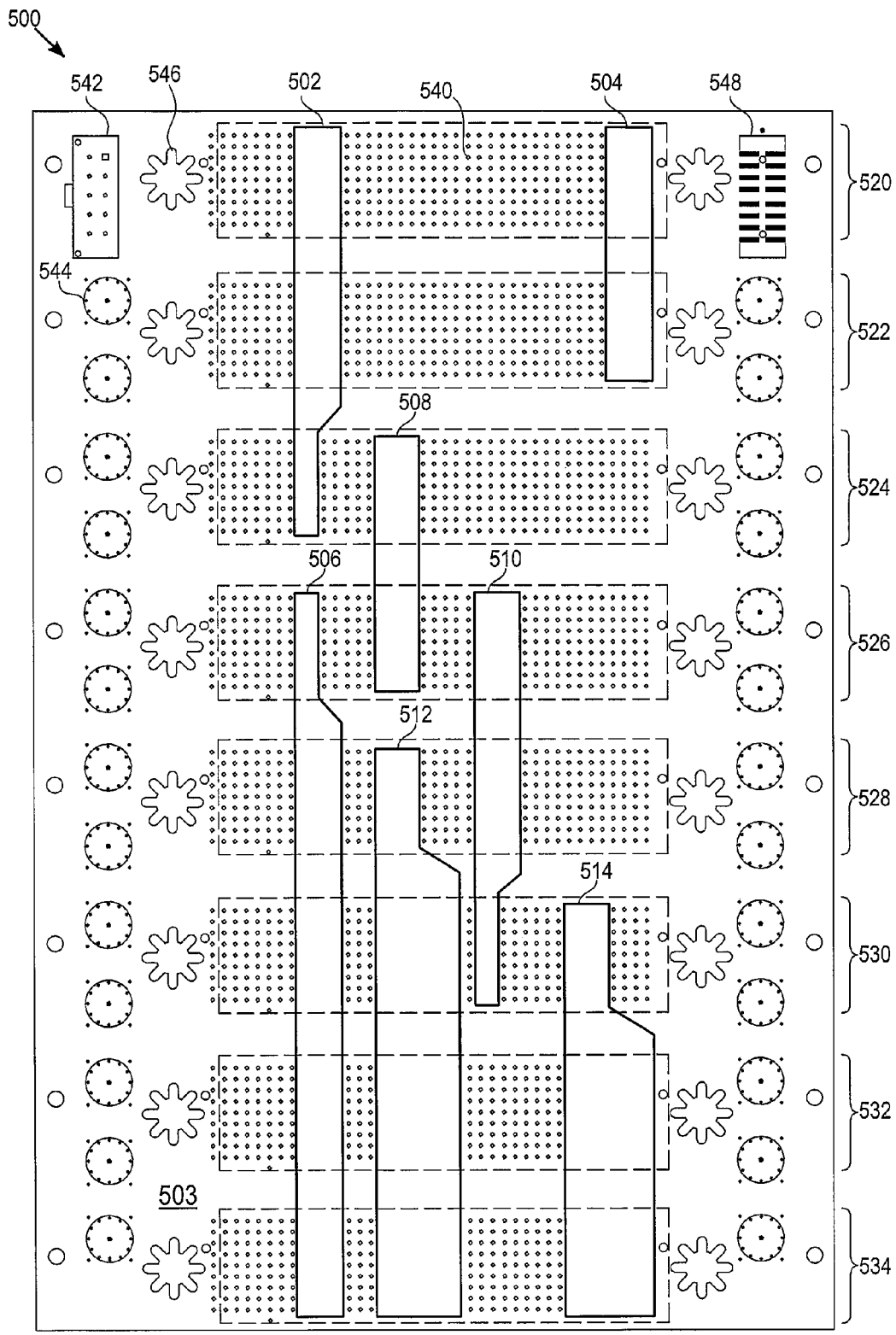
FIG. 5 is a top view of several Signal Mapping Overlay devices, such as of FIGS. 1-3, attached to a backplane printed circuit board.
Figure 5A:
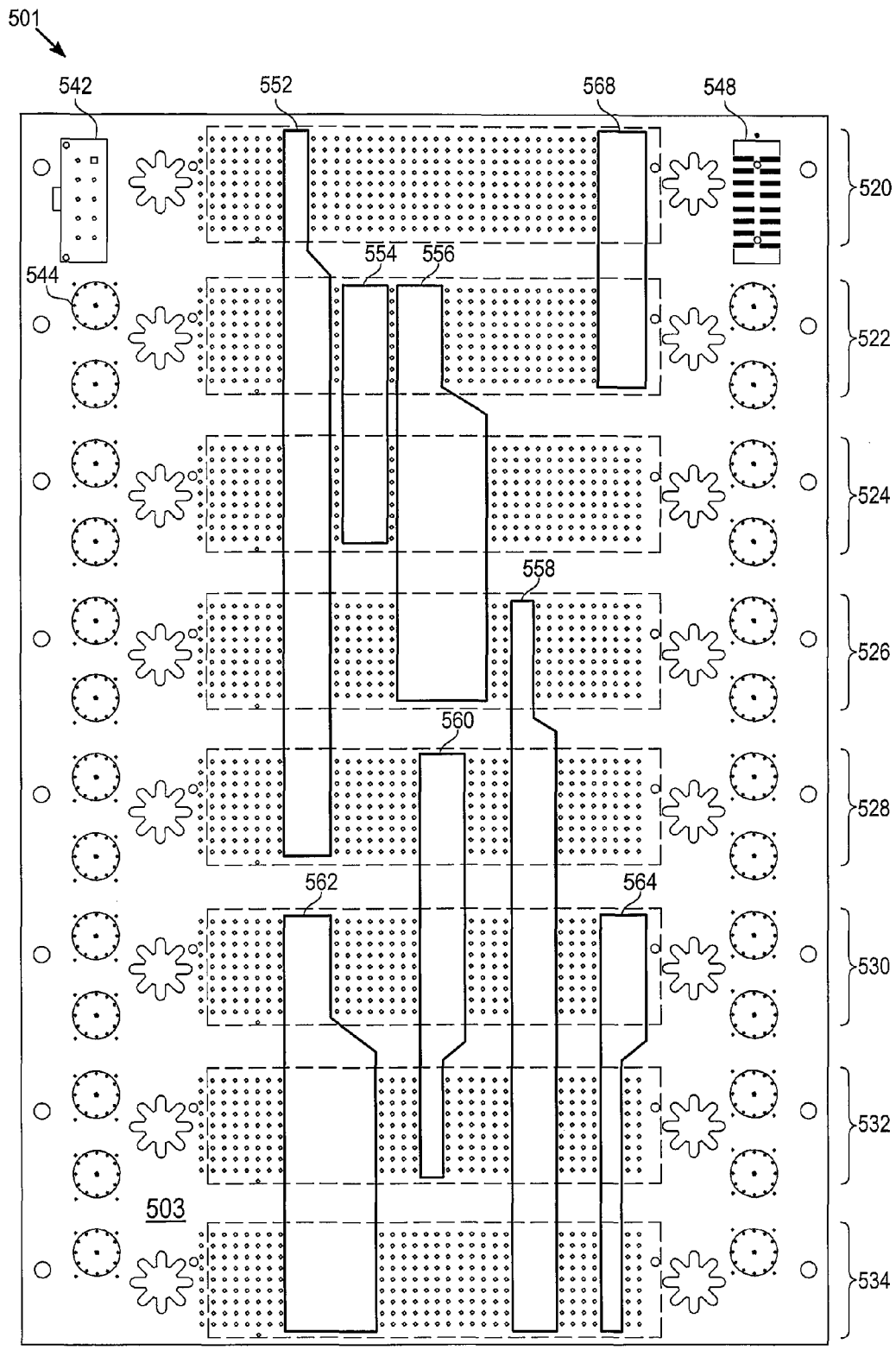
FIG. 5a is a top view of several Signal Mapping Overlay devices, such as of FIGS. 1-3, attached to a backplane printed circuit board in an alternate connection pattern.

With reference to FIGS. 5 and 5A, a signal-mapping face 503 of the backplane printed circuit board 500, 501 is shown, with differing sets of attached Signal Mapping Overlay boards 502, 504, 506, 508, 510, 512, 514 and 552, 554, 556, 558, 560, 562, 564, 568. The Signal Mapping Overlays in FIGS. 5 and 5A show several different connection configurations and shapes of the various devices. These devices can be used in other configurations and are not limited to those shown here. Signal re-mapping using Signal Mapping Overlay boards can connect signals from one slot to another slot. Each of the eight horizontally oriented arrays 520, 522, 524, 526, 528, 530, 532, 534 of solder ball mounting pads shown on the backplane printed circuit board 500, 501 is associated with a respective slot, and each slot has an associated connector soldered, press-fitted or otherwise installed to the connector face (not shown) of the backplane printed circuit board 500, 501. The signal-mapping face 503 and the connector face are opposing faces of the backplane printed circuit board 500, 501.

For example, the Signal Mapping Overlay board 502 connects to three slots corresponding to the three solder ball mounting pad arrays 520, 522, 524. A master slot, in one embodiment, provides signal sources. In further embodiments, a master slot provides bus arbitration for multi-master systems in which other slots can ask for and take over as bus master. The first slot on the top, corresponding to the uppermost solder ball mounting pad array 520 is in this example called the master as it is sending signals to the two slots below called the slave or target slots. This Signal Mapping Overlay board 502 is called a 2 lane-2 slot overlay, because the master slot runs 2 lanes of re-mapped signals per 1 slot for 2 slots. Each lane provides a signal path, and additional signal layers support additional lanes. The Signal Mapping Overlay board 504 connects two slots, corresponding to the two solder ball mounting pad arrays 520, 522. The Signal Mapping Overlay board 504 is called a 4 lane-1 slot overlay. The 4 lane-1 slot Signal Mapping Overlay board 504 is similar to the 2 lane-2 slot Signal Mapping Overlay board 502, however, it is double in lane size. The respective master slot is the slot on the top and the slaves or target slots are below, with 4 lanes of re-mapped signal per slot. The Signal Mapping Overlay board 506 connects 5 slots and has one lane of signal re-mapping per slot for 4 slots. The Signal Mapping Overlay board 506 is called a 1 lane-4 slot overlay. Variations may be devised, with slots oriented horizontally and master slots being at the top, the bottom, or in between, or with slots oriented vertically and master slots at the left, the right or the middle and so on.

Additionally, it should be understood that while the entire backplane may be manufactured with ball mapping technology adjacent to each and every connector through-hole, only the solder ball connections corresponding to a selected signal mapping are utilized to complete a given Signal Mapping Overlay; this is done via industry standard soldering techniques. Internal fabric and signals remain standardized within the backplane, thus keeping production runs consistent. The ball grid array (BGA) on the backplanes' surface provides increased flexibility and allows accommodation of customer specific signal mapping requirements at a reduced cost. In one embodiment, solder balls are attached only to the Signal Mapping Overlay printed circuit board. Solder paste is used on the backplane printed circuit board, to receive the solder balls and form attachment when solder processing is completed.

One feature of the Signal Mapping Overlay devices is that they can be made to have a master slot on the end of the overlay or in the middle of the device. This feature allows the design of shorter signal lanes between slots and without degrading the signal strength or speed. This allows flexibility in regards to backplane signal re-mapping. Using custom designed signal overlays allows for additional backplane signal connection options with regard to using rear connectors. Various rear connectors can be used with the overlays with little to no modification to either the connector or overlay device after it is installed. As an example, a transition module (TM) connector is a type of rear connector which may be mounted to a backside or rear of a backplane. A TM connector is used to bring signals from a front payload board out the back of a chassis, via a rear transition module plugged into the TM connector. Other types of connectors, such as a front panel I/O connector, an in-box connector or a drive connector can be located on a frontside or backside of a backplane printed circuit board, and have signals mapped by a Signal Mapping Overlay device. A backplane printed circuit board 500 may have further devices on board, such as jumpers 542, heatsinks 546, transistor drivers 544, switches 548 and so on, as shown for illustration purposes in FIG. 5.

The physical size of a Signal Mapping Overlay device is customizable, and may be dimensioned according to the physical distance from the "master" slot to the intended "slave or target" slot or slots and the size of the backplane connector areas. The device may be further dimensioned according to the location of the signal or signals to which the device is connected in each of two or more slots.

The construction details of the Signal Mapping Overlay, as shown in FIGS. 1-5A, include that the electrically conducting portions of the Signal Mapping Overlay may be made of copper or of any other sufficiently conductive material such as gold, silver, and the like. Further, the various electrically insulating or dielectric components of the Signal Mapping Overlay can be made of various materials. The completed Signal Mapping Overlay device may be constructed using variations of the industry proven techniques and materials used in manufacturing other printed circuit boards as known or devised by a person skilled in the art.

Figure 6A:
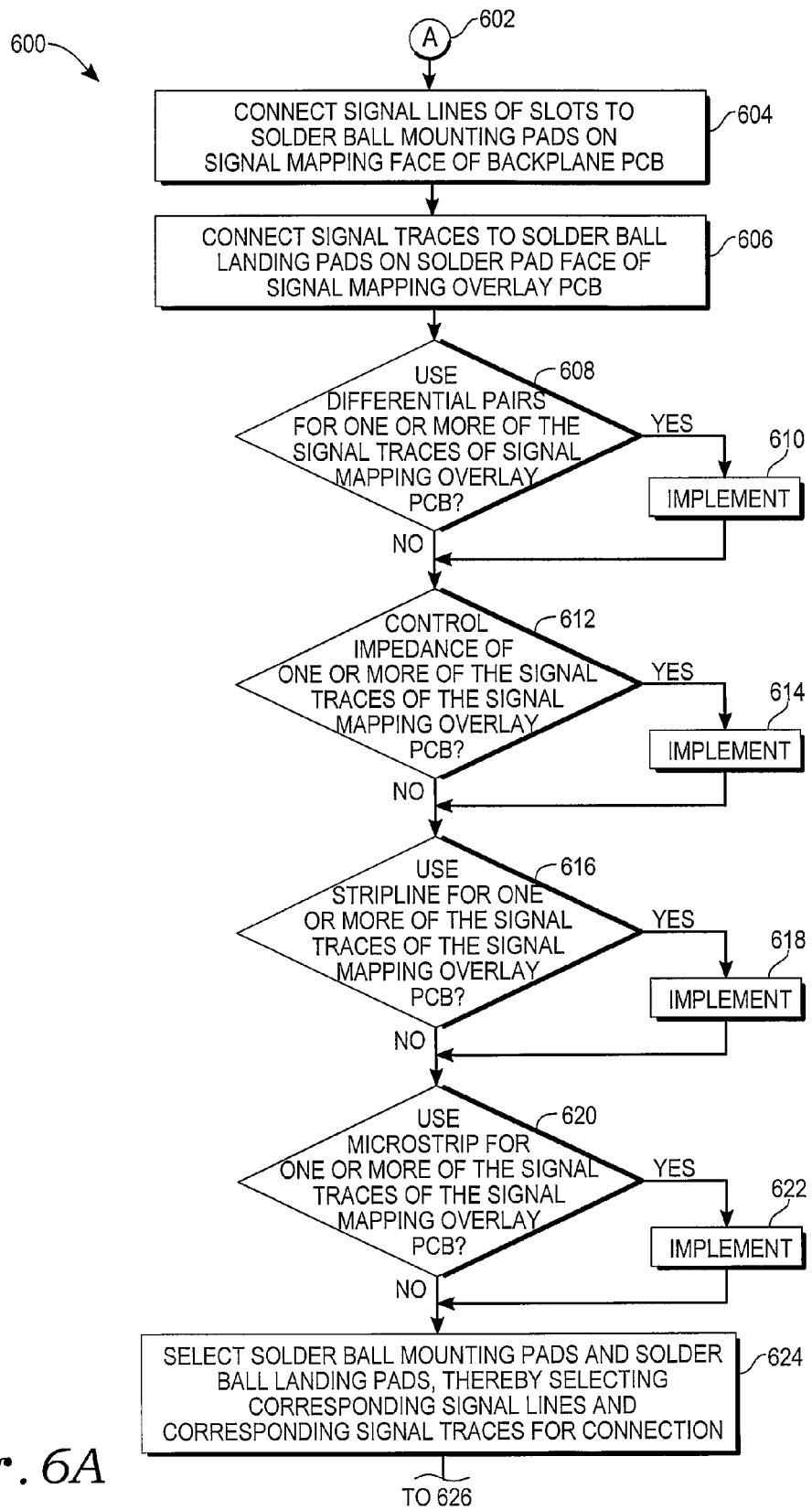
FIGS. 6A and 6B show a flow diagram of a method for interconnecting slots on a backplane, which may be practiced using one or more Signal Mapping Overlay boards, such as shown in FIG. 1.
Figure 6B:
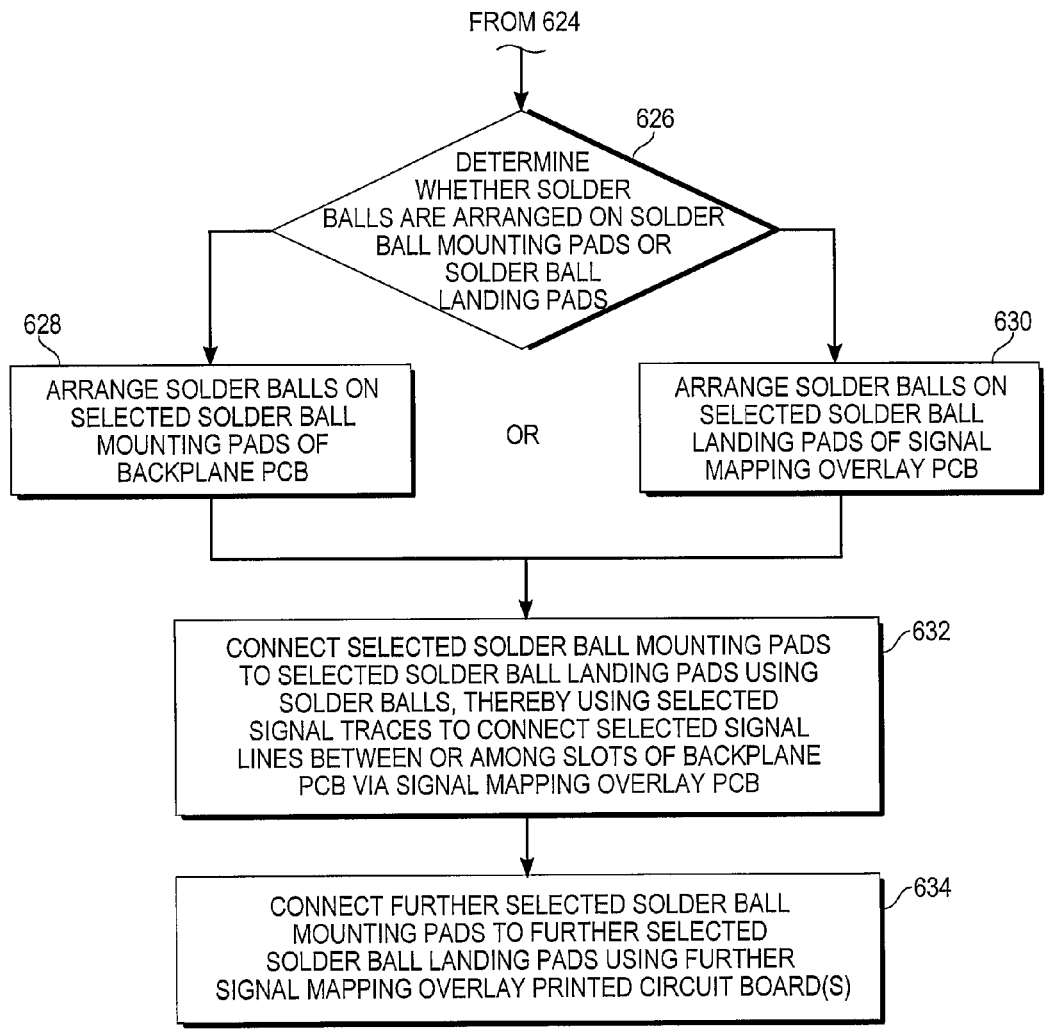

With reference to FIG. 6, a method 600 is shown for interconnecting slots on a backplane. The method may be practiced using the backplane printed circuit board and one or more instances of the Signal Mapping Overlay board. In a block 602, the method 600 starts at entry point "A". In a block 604, signal lines of slots are connected to solder ball mounting pads on the signal mapping face of the backplane printed circuit board (PCB). In a block 606, signal traces are connected to solder ball landing pads on the solder pad face of a Signal Mapping Overlay printed circuit board. In a block 608, the question is asked: are differential pairs used for one or more of the signal traces of the Signal Mapping Overlay printed circuit board? If yes, in a block 610, the use of differential pairs for one or more of the signal traces of the Signal Mapping Overlay circuit board is implemented, and flow continues to block 612. If no, flow continues to block 612. In a block 612, the question is asked: is impedance to be controlled for one or more of the signal traces of the Signal Mapping Overlay printed circuit board? If yes, in a block 614, controlled impedance is implemented for one or more of the signal traces of the Signal Mapping Overlay printed circuit board, and flow continues to block 616. If no, flow continues to block 616. In a block 616, the question is asked: is stripline used for one or more of the signal traces of the Signal Mapping Overlay printed circuit board? If yes, in a block 618, stripline is implemented for one or more of the signal traces of the Signal Mapping Overlay printed circuit board, and flow continues to block 620. If no, flow continues to block 620. In a block 620, the question is asked: is microstrip used for one or more of the signal traces of the Signal Mapping Overlay printed circuit board? If yes, in a block 622, microstrip is implemented for one or more of the signal traces of the Signal Mapping Overlay printed circuit board, and flow continues to block 624. If no, flow continues to block 624. In a block 624, solder ball mounting pads are selected and solder ball landing pads are selected. Thereby, corresponding signal lines of the slots of the backplane printed circuit board and corresponding signal traces of the Signal Mapping Overlay printed circuit board are selected for connection. In a block 626, a determination is made as to whether solder balls are arranged on the solder ball mounting pads or are arranged on the solder ball landing pads. Flow continues to block 628 or block 630 accordingly. In a block 628, the solder balls are arranged on selected solder ball mounting pads of the backplane printed circuit board. Flow continues to block 632. In a block 630, the solder balls are arranged on selected solder ball landing pads of the Signal Mapping Overlay printed circuit board. Flow continues to block 632. In a block 632, the selected solder ball mounting pads are connected to the selected solder ball landing pads using solder balls. Thereby, selected signal traces are used to connect selected signal lines between or among slots of the backplane printed circuit board via the Signal Mapping Overlay printed circuit board. In a block 634, further selected solder ball mounting pads are connected to further solder ball landing pads using one or more further Signal Mapping Overlay printed circuit boards.

The advantages of the Signal Mapping Overlay include a complete customizable signal remapping of the backplane, allowing for select signal connections from connector to connector. Additional benefits include shorter and faster communication lanes between connections cutting signal lag time, increased flexibility, reduced cost and setup time. The signal path (lane) design, using matched differential pairs, keeps signal quality intact and limits unwanted signal distortion and electro-migration of signals between transmitting and receiving paths, further increasing its benefits in high speed signal use in backplanes.

A still further advantage is the enabling of rapid prototyping and/or small batches of customized backplanes, using selected Signal Mapping Overlay devices to connect selected signals between selected slots and associated backplane connectors. In a prototyping and/or small batch method, a customized backplane is made by attaching the selected Signal Mapping Overlay devices, using solder balls at selected locations, to the backplane printed circuit board so as to configure the signal connections among the slots and associated backplane connectors. The prototyping and/or small batch method is scalable to volume manufacturing. In a further embodiment, other types of electrically conductive interconnects are used in place of or in addition to the solder ball connections. Other types of electrically conductive interconnects include press-fit pin into hole connections, spring-loaded pins, metal to metal contact, and solderless connectors.

In broad embodiment, the Signal Mapping Overlay includes a device that attaches to a backplane, remapping chosen signals from one connector to another or to multiple connecters. While a method, a system and an apparatus or device have been particularly shown and described with references to preferred embodiments thereof, it will be understood by those skilled in the art that various changes in form and details may be made therein without departing from the spirit and scope as defined.

While the foregoing written description of the method, system and apparatus or device enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

What is claimed is:

1. A backplane apparatus comprising:
   a backplane printed circuit board having a plurality of defined slots and signal lines therefrom connected to a first connection array; and
   at least one signal mapping overlay printed circuit board having signal paths connecting to a second connection array, with the first connection array and the second connection array forming one or more mirrored connection arrays supporting selectable location of a plurality of conductive interconnects that selectably connect signal lines from two or more of the slots via the signal paths of the signal mapping overlay printed circuit board, the signal paths of the at least one mapping overlay printed circuit board constructed with controlled electrical characteristics, including impedance, such that signal distortion is limited so as to keep signal quality intact throughout the respective connections.

2. The backplane apparatus of claim 1 wherein:
the mirrored connection arrays include solder pads in the first connection array and further solder pads in the second connection array; and
the conductive interconnects are solder balls.

3. The backplane apparatus of claim 1 wherein each of the slots is associated with a respective connector routing a portion of the signal lines to or from a respective electronic card or module.

4. The backplane apparatus of claim 1 wherein the signal mapping overlay printed circuit board has striplines or microstrips for the signal paths, each stripline or microstrip constructed with a width to obtain a selected characteristic impedance per unit length.

5. The backplane apparatus of claim 1 wherein the signal paths on the signal mapping overlay printed circuit board include differential pairs having matched lengths.

6. A backplane system comprising:
a backplane printed circuit board having a circuit board connector face, a signal-mapping face and a plurality of defined slots including a first slot and a second slot, each slot having on the circuit board connector face a connector configured to receive a respective card or module and having on the signal-mapping face an array of solder ball mounting pads corresponding to signal lines of the slot;
at least one signal mapping overlay printed circuit board having:
a plurality of signal traces; and
a first solder ball landing pad at a first end of each signal trace and a second solder ball landing pad at a second end of each signal trace;
a first solder ball selectably located on the array of solder ball mounting pads and electrically connecting a solder ball mounting pad of a signal line of the first slot to a first solder ball landing pad of one of the signal traces; and
a second solder ball selectably located on the array of solder ball mounting pads and electrically connecting a solder ball mounting pad of a signal line of the second slot to a second solder ball landing pad of the one of the signal traces;
wherein the signal line of the first slot is connected to the signal line of the second slot via the one of the signal traces on the signal mapping overlay printed circuit board, the signal traces of the at least one mapping overlay printed circuit board constructed with controlled electrical characteristics, including impedance, such that signal distortion is limited so as to keep signal quality intact throughout the respective connections between slots.

7. The backplane system of claim 6 wherein the first and second solder ball landing pads of the signal mapping overlay printed circuit board are on a solder pad face of the signal mapping overlay printed circuit board.

8. The backplane system of claim 6 further comprising further solder balls electrically connecting further ones of the signal traces of the signal mapping overlay printed circuit board to further signal lines of the slots.

9. The backplane system of claim 6 further comprising at least one further signal mapping overlay printed circuit board electrically connecting further signal lines of the slots.

10. The backplane system of claim 9 wherein at least one of the signal mapping overlay printed circuit boards includes two or more lanes.

11. The backplane system of claim 6 wherein each signal trace on the signal mapping overlay printed circuit board is impedance-controlled.

12. The backplane system of claim 6 wherein each signal trace on the signal mapping overlay printed circuit board forms a stripline or a microstrip, each stripline or microstrip constructed with a width to obtain a selected characteristic impedance per unit length.

13. The backplane system of claim 6 wherein the signal mapping overlay printed circuit board is a multilayer circuit board having one or more ground planes, the multilayer circuit board having dielectric layer thicknesses selected to provide controlled amount of capacitance between signal layers and ground planes.

14. A method for interconnecting slots on a backplane, the method comprising:
connecting signal lines of slots of a backplane printed circuit board to arrays of solder ball mounting pads on a signal mapping face of the backplane printed circuit board;
connecting signal traces of a signal mapping overlay printed circuit board to solder ball landing pads on a solder pad face of the signal mapping overlay printed circuit board; and
connecting selected solder ball mounting pads to selected solder ball landing pads using solder balls, thereby using selected signal traces to connect selected signal lines between or among the slots via the signal mapping overlay printed circuit board, the signal traces of the signal mapping overlay printed circuit board constructed with controlled electrical characteristics, including impedance, such that signal distortion is limited so as to keep signal quality intact throughout the respective connections between or among slots.

15. The method of claim 14 further comprising arranging the solder balls on the selected solder ball mounting pads of the backplane printed circuit board signal mapping face, prior to connecting the selected solder ball mounting pads to the selected solder ball landing pads using the solder balls.

16. The method of claim 14 further comprising arranging the solder balls on the selected solder ball landing pads of the signal mapping overlay printed circuit board solder pad face, prior to connecting the selected solder ball mounting pads to the selected solder ball landing pads using the solder balls.

17. The method of claim 14 further comprising connecting further selected solder ball mounting pads to further selected solder ball landing pads using at least one further signal mapping overlay printed circuit board.

18. The method of claim 14 further comprising using differential pairs for one or more of the signal traces of the signal mapping overlay printed circuit board, the differential pairs having matching lengths.

19. The method of claim 14 further comprising controlling an impedance of one or more of the signal traces of the signal mapping overlay printed circuit board.

20. The method of claim 19 wherein controlling the impedance of the one or more of the signal traces includes using a stripline or a microstrip for the one or more of the signal traces of the signal mapping overlay printed circuit board, each stripline or microstrip constructed with a width to obtain a selected characteristic impedance per unit length.

* * * * *